United States Patent
Yang

(10) Patent No.: US 8,148,781 B2
(45) Date of Patent: Apr. 3, 2012

(54) METHOD AND STRUCTURES OF MONOLITHICALLY INTEGRATED ESD SUPPRESSION DEVICE

(75) Inventor: Xiao (Charles) Yang, Cupertino, CA (US)

(73) Assignee: MCube Inc., San Jose, CA (US)

( * ) Notice: Subject to any disclaimer, the term of this patent is extended or adjusted under 35 U.S.C. 154(b) by 429 days.

(21) Appl. No.: 12/511,002

(22) Filed: Jul. 28, 2009

(65) Prior Publication Data

US 2010/0187652 A1 Jul. 29, 2010

Related U.S. Application Data

(60) Provisional application No. 61/084,226, filed on Jul. 28, 2008.

(51) Int. Cl.
*H01L 27/12* (2006.01)
*H01L 31/0392* (2006.01)
(52) U.S. Cl. ........................................ 257/355; 257/358
(58) Field of Classification Search .......... 257/355–363, 257/E27.06, E29.255
See application file for complete search history.

(56) References Cited

U.S. PATENT DOCUMENTS

| 6,097,066 A | * | 8/2000 | Lee et al. | 257/355 |
| 7,470,957 B2 | * | 12/2008 | Gossner | 257/355 |
| 7,709,896 B2 | * | 5/2010 | Russ et al. | 257/355 |

* cited by examiner

*Primary Examiner* — Cuong Q Nguyen
(74) *Attorney, Agent, or Firm* — Kilpatrick Townsend and Stockton LLP

(57) ABSTRACT

This present invention relates in general to protection of integrated circuit chips, and more particularly, to a micromachined suppression device for protecting integrated circuit chips from electrostatic discharges. The proposed ESD suppression device consists of conductive pillars are dispersed in a dielectric material. The gaps between each pillar behave like spark gaps when a high voltage ESD pulse occurs. When the voltage of the pulse reaches the "trigger voltage" these gaps spark over, creating a very low resistance path. In normal operation, the leakage current and the capacitance is very low, due to the physical gaps between the conductive pillars. The proposed ESD suppression device is fabricated using micromachining techniques to be on-chip with device ICs.

18 Claims, 7 Drawing Sheets

METHOD AND STRUCTURES OF MONOLITHICALLY INTEGRATED ESD SUPPRESSION DEVICE

CROSS-REFERENCES TO RELATED APPLICATIONS

Figure 1:
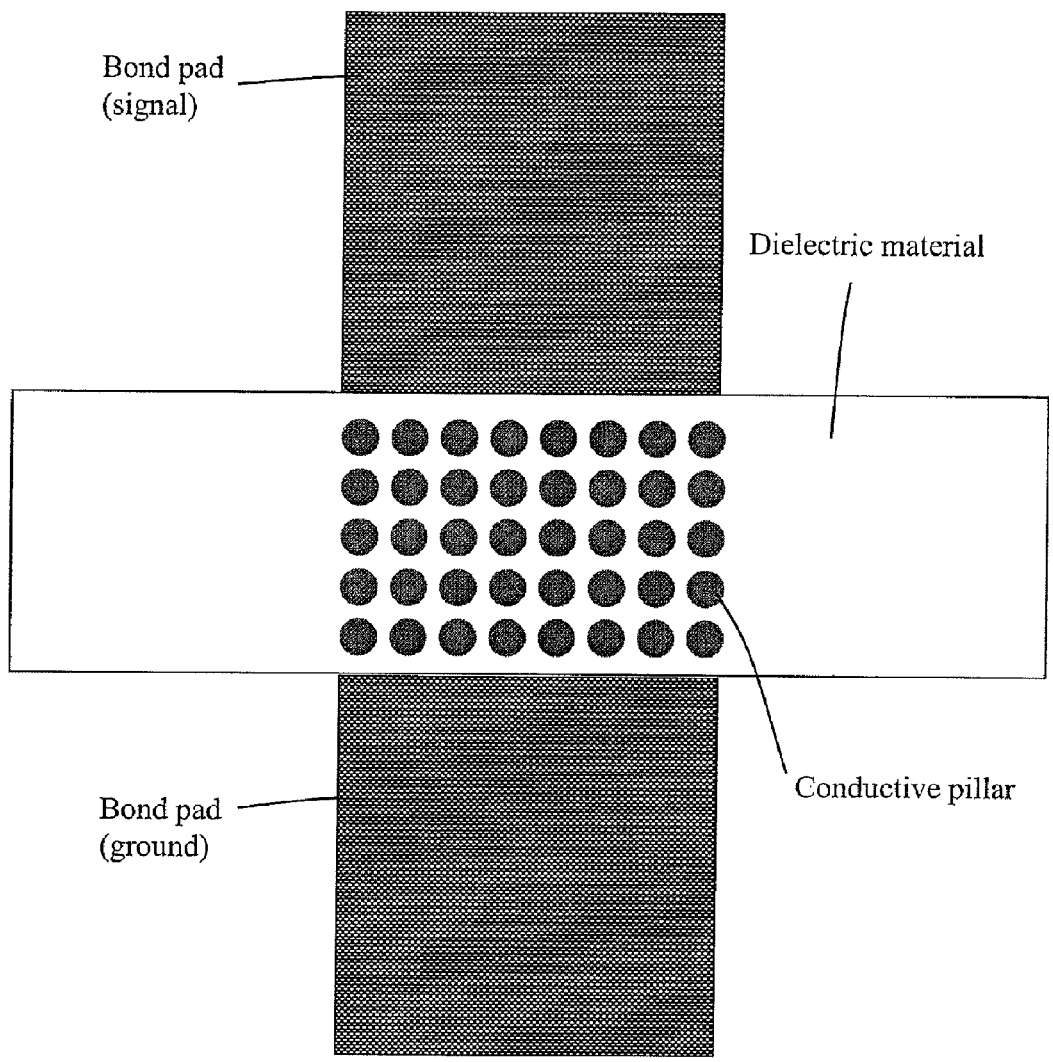

This application claims priority to U.S. Provisional Patent Application Ser. No. 61/084,226, filed Jul. 28, 2008, entitled "METHOD AND STRUCTURE OF MONOLITHICALLY INTEGRATED ESD SUPPRESSION DEVICE" by inventor XIAO (CHARLES) YANG commonly assigned and incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

This present invention relates in general to protection of integrated circuit chips, and more particularly, to a micromachined suppression device for protecting integrated circuit chips from electrostatic discharges or other potentially damaging voltage transients occurring during device fabrication and in use in field.

Electrostatic discharge (ESD) is a phenomenon known to degrade or destroy electronic components. In particular, given the decreasing size of circuit features with ever improving process technology, static electricity can destroy or substantially harm many of today's integrated circuits. Electrostatic discharge can occur, for example, from human handling, automated circuit testing or as a packaged circuit slides on its pins across another surface. The circuits most susceptible to damage are unpackaged or packaged finished circuits which have not yet been installed into a finished product. Once installed, for example, onto a circuit card, other means exist to protect the circuits from damage.

Various techniques have been employed to protect integrated circuit chips handled by humans during the fabrication process. These methods include special handling procedures, use of grounding equipment and the addition of protective components to the chip circuitry. The most popular technique used to protect complementary metal-oxide semiconductor (CMOS) circuits from an ESD event is the addition of diffused or implanted dual clamping diodes to clamp input and output voltages to within the boundaries of the chip's power supply connections. Such dual diodes are coupled between the input/output pads of the circuit and the pins to which the power supplies are connected. With an electrostatic discharge event of one polarity, a first diode is forward biased and with a discharge event of the opposite polarity, the second diode is forward biased. Other methods used for protecting CMOS circuits from electrostatic discharge damage are typically variations on this dual diode clamping approach. A variety of technologies are used for ESD protection both on-chip and off-chip. However, the incumbent technologies have limitations.

Furthermore, while most circuit protection needs for portable and wireless devices can be met with discrete devices, space and higher-volume manufacturing are also dictating use of integrated passive devices.

Thus, it is desirable to improve ESD suppression devices.

BRIEF SUMMARY OF THE INVENTION

This present invention relates in general to protection of integrated circuit chips, and more particularly, to a micromachined suppression device for protecting integrated circuit chips from electrostatic discharges or other potentially damaging voltage transients occurring during device fabrication and in use in field.

The proposed ESD suppression device consists of conductive pillars are dispersed in a dielectric material. The gaps between each pillar behave like spark gaps when a high voltage ESD pulse occurs. When the voltage of the pulse reaches the "trigger voltage" these gaps spark over, creating a very low resistance path. In normal operation, the leakage current and the capacitance is very low, due to the physical gaps between the conductive pillars.

The proposed ESD suppression device is fabricated using micromachining techniques. In a embodiment, the ESD suppression device is fabricated on-chip with device ICs. In another embodiment, the ESD suppression device is a standalone discrete component.

DETAILED DESCRIPTION OF THE INVENTION

According to the present invention, techniques for fabricating ESD suppression device are provided. More particularly, the invention includes a method and structure for fabricating ESD suppression device with conductive pillars are dispersed in a dielectric material. Merely by way of example, the invention has been applied to fabricating ESD suppression device. But it would be recognized that the invention has a much broader range of applicability.

FIG. 1 is a simplified top-view diagram illustrating components of a pillar ESD suppression device according to one embodiment of the present invention. The following diagrams are merely examples, which should not unduly limit the scope of the claims herein. One of ordinary skill in the art would recognize many variations, alternatives, and modifications.

As illustrated, the pillar ESD suppression device is consisted of a pair of electrodes with conductive pillars dispersed in a dielectric material. The conductive pillars are made of conductive materials such as Al, Cu, W, Au, Ti, TiN, TiW, doped silicon, or conductive polymers. The dielectric material includes not limit to silicon dioxide, silicon nitride, spin-on glass, non-conductive polymers, inert gases, or vacuum. In an embodiment, the spacing or gap between the pillars is a constant ranging from 10 s nanometers to 10 s micrometers. In another embodiment, the spacing or gap between the pillars is a variable ranging from 10 s nanometers to 10 s micrometers.

Figure 2:
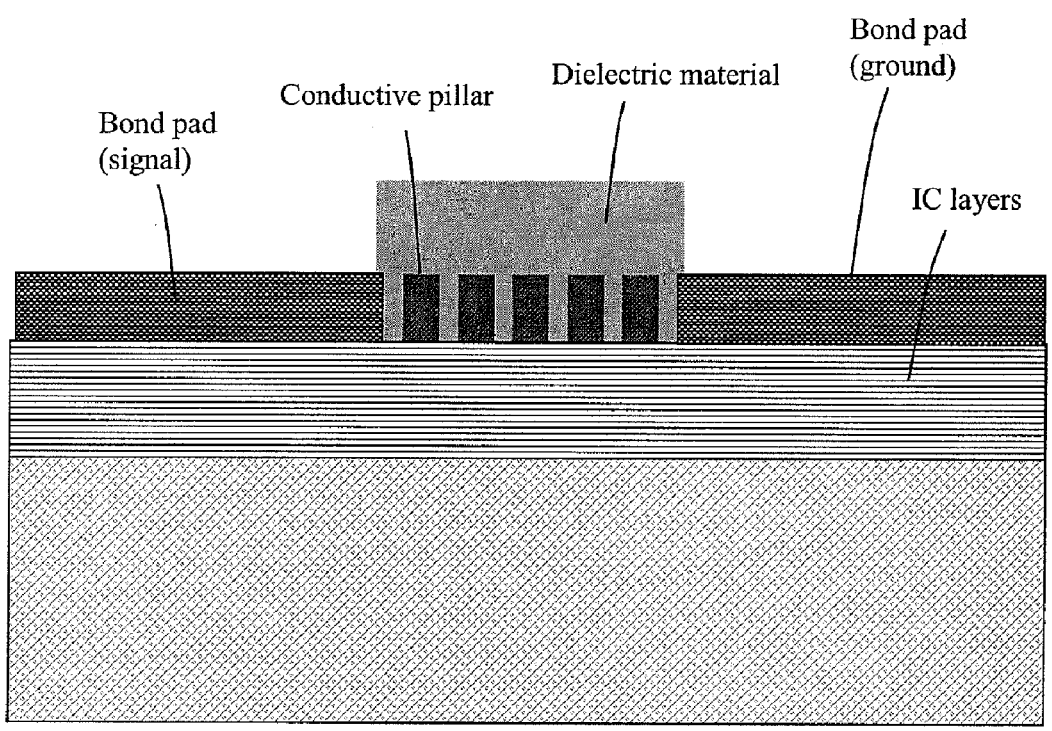

FIG. 2 is a simplified cross-sectional diagram illustrating components of a pillar ESD suppression device according to one embodiment of the present invention. As illustrated, the conductive pillars are dispersed in a dielectric material. The height of the pillars ranges from 100 s nanometers to 10 s micrometers. In an embodiment, the pillar ESD suppression is fabricated on top of an integrated circuit (IC) device. In another embodiment, the pillar ESD suppression is fabricated on top of a substrate without integrated circuit (IC) device.

Figure 3:
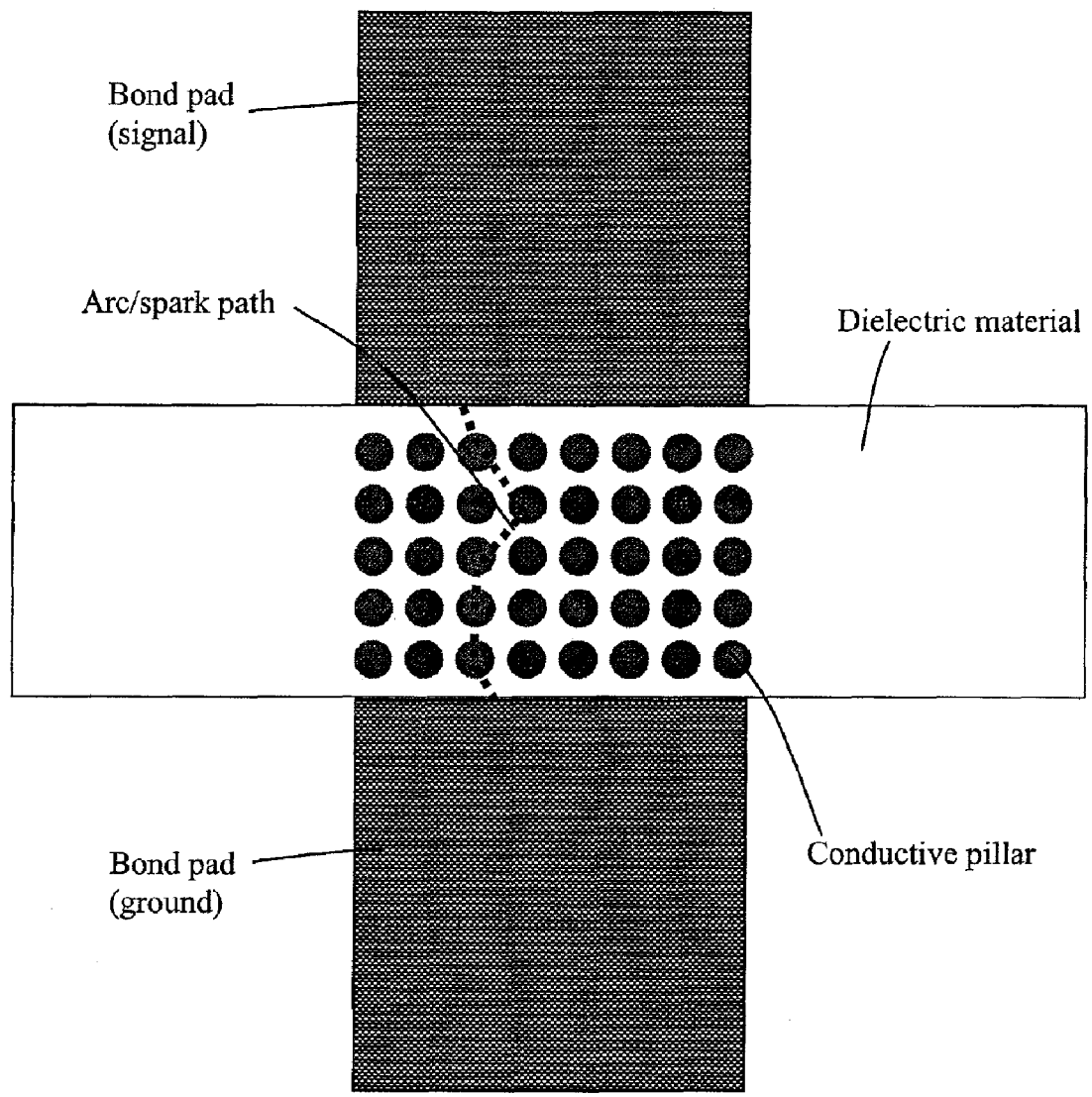

FIG. 3 is a simplified top-view diagram illustrating working principle of a pillar ESD suppression according to one embodiment of the present invention. As depicted, the gaps between each pillar behave like spark gaps when a high voltage ESD pulse occurs. When the voltage of the pulse reaches the "trigger voltage" these gaps spark over, creating a very low resistance path. In normal operation, the leakage current and the capacitance is very low, due to the physical separation gaps between the conductive pillars.

Figure 4:
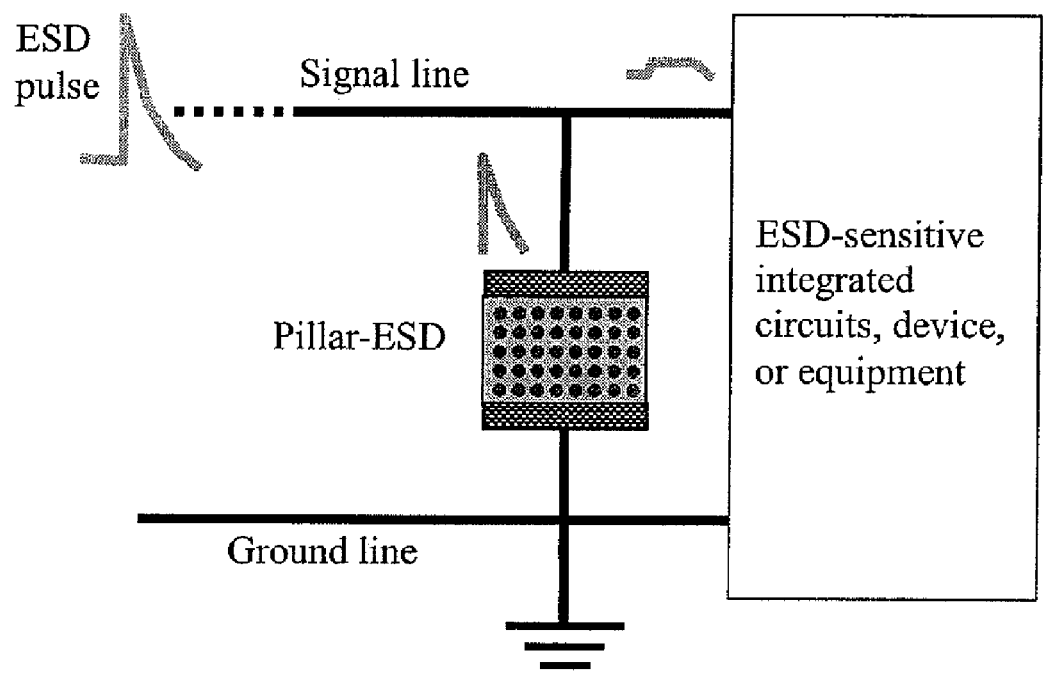

FIG. 4 is a simplified block diagram illustrating of a typical ESD protection-wiring scheme using a pillar ESD suppression device according to one embodiment of the present invention. As depicted, pillar ESD suppression device is 'shunted' between a signal line and ground line before the ESD sensitive device or equipment. When an ESD pulse occurs on the signal line and reaches the "trigger voltage", the pillar ESD suppression device creates a very low resistance path that shunts the high voltage ESD pulse to the ground and leaves a safe 'clamped' portion of the signal goes into an integrated circuits, electronic device or equipment. In normal operation, the leakage current and the capacitance is very low, due to the physical separation gaps between the conductive pillars.

Figure 5:
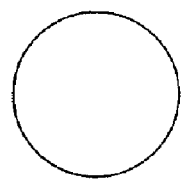
Figure 5:
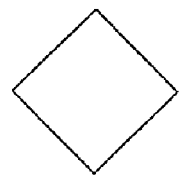
Figure 5:
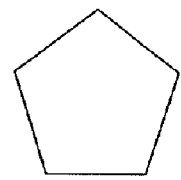
Figure 5:
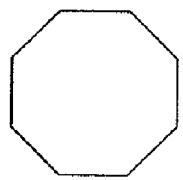
Figure 5:
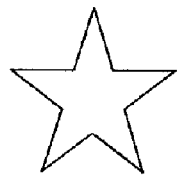
Figure 5:
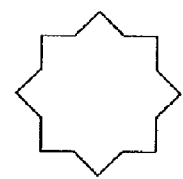

FIG. 5 is a simplified top-view diagram illustrating variations of the pillar shapes of a pillar ESD suppression device according to one embodiment of the present invention. As depicted, the pillar ESD suppression device may have different shapes of pillars. The pillar shape works in concert with the pillar spacing to determine the arc or spark voltage level. The pillar ESD suppression device may have one or more shapes of pillars.

Figure 6:
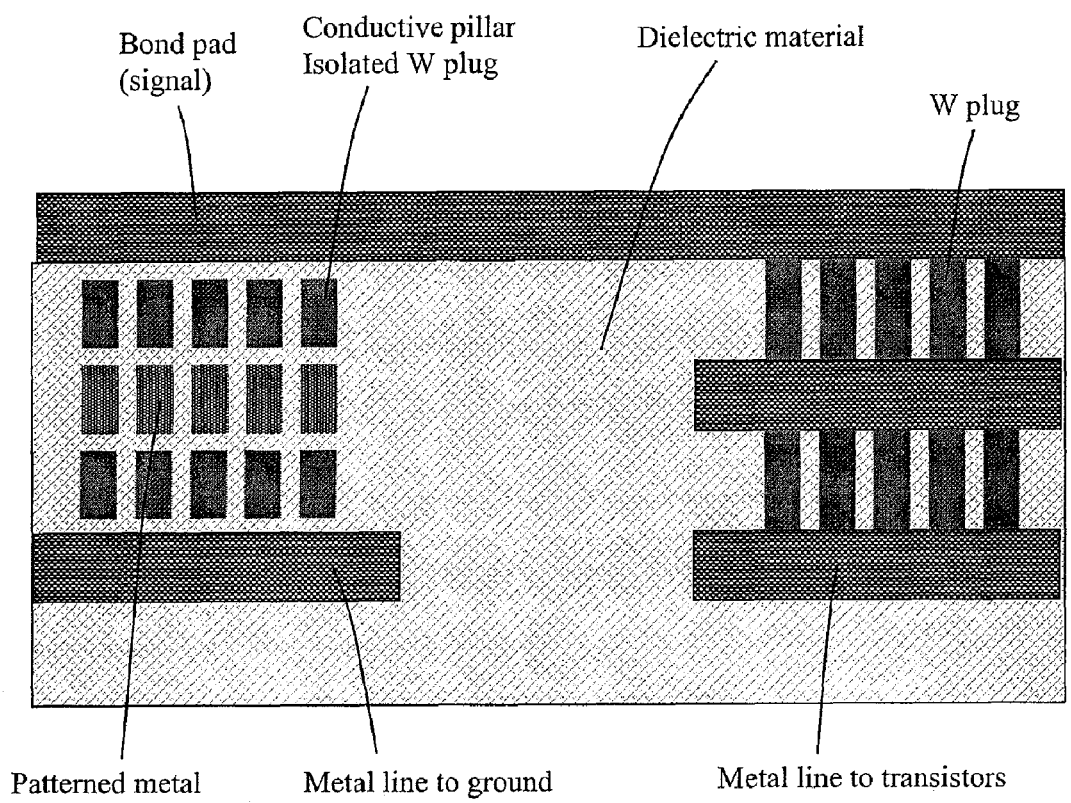

FIG. 6 is a simplified cross-sectional diagram illustrating components of a pillar ESD suppression device according to one embodiment of the present invention. As illustrated, the conductive pillars are dispersed in a dielectric material in a vertical configuration. The pillars are consisted of isolated tungsten plugs and patterned metal that are dispersed in a dielectric materials such as oxide. In a specific embodiment, the top metal of the ESD device is a portion of a bond pad and the bottom metal connects to a ground.

Figure 7:
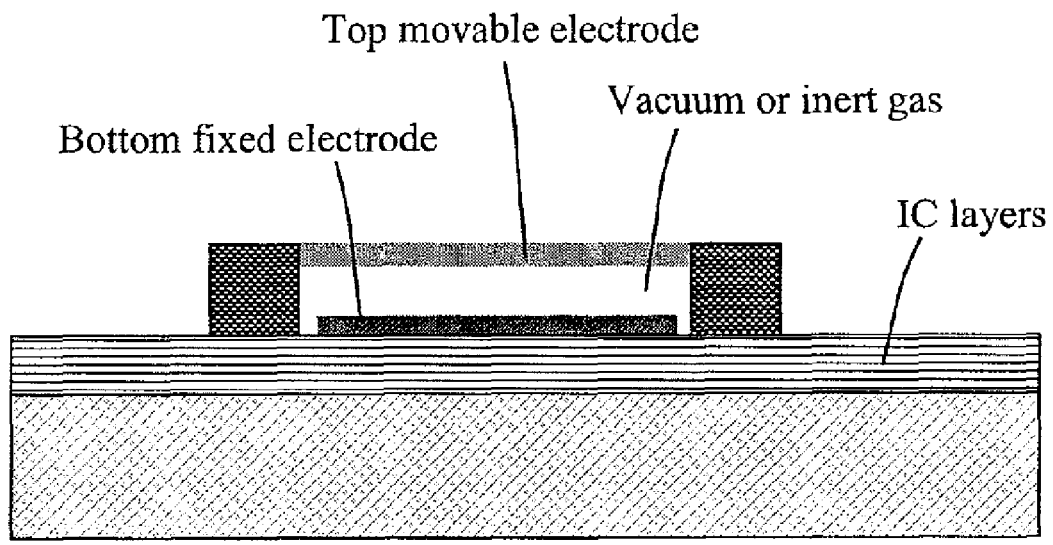

FIG. 7 is a simplified cross section view diagram illustrating another configuration of the pillar shapes of a pillar ESD suppression device according to one embodiment of the present invention. As depicted, the pillar ESD suppression device consists of a top moving electrode and a bottom fixed electrode. The gap between the top and bottom electrodes is a vacuum or an inert gas depending on specific ESD suppression requirements. When the voltage of the ESD pulse reaches the "trigger voltage", the top movable electrode is 'pulled in' and collapse to the bottom electrode and create a very low resistance path. In normal operation, the leakage current and the capacitance is very low, due to the physical gaps that separates the top and bottom electrodes.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An electrostatic discharge device for an integrated circuit, the device comprising:
   a semiconductor substrate;
   a voltage discharge region overlying an inner portion of the semiconductor substrate, the voltage discharged region comprising:
   a plurality of conductive regions arranged as an array, the array being numbered from 1 through N in a first direction and the array being numbered from 1 through M in a second direction;
   a dielectric material provided spatially around each of the conductive regions to form a thickness of material having a surface region;
   an input region coupled to a first region of the plurality of conductive regions;
   an output region coupled to a second region of the plurality of conductive regions;
   an input line provided overlying a first region of the semiconductor substrate region and coupled to the input region of the plurality of conductive regions; and
   an output line provided overlying a second region of the semiconductor substrate region and coupled to the output region of the plurality of conductive regions.

2. The device of claim 1 wherein the input line is coupled to a bond pad.

3. The device of claim 1 wherein the input line is coupled to an input pad.

4. The device of claim 1 wherein the input line is coupled to one or more integrated circuit modules.

5. The device of claim 1 wherein the output line is coupled to a ground potential.

6. The device of claim 1 wherein the output line is coupled to one or more integrated circuit modules.

7. The device of claim 1 wherein the plurality of conductive regions comprise, respectively, a plurality of pillars.

8. The device of claim 1 wherein each of the plurality of conductive regions is characterized by a column shape.

9. The device of claim 1 wherein each pair of the conductive regions is separated by a portion of the dielectric material.

10. The device of claim 9 wherein the dielectric material is selected from air, silicon dioxide, silicon nitride, silicon oxynitride, or other dielectric species.

11. The device of claim 1 wherein at least two of the conductive regions is separated by a predetermined gap, the gap including a portion of dielectric material therein provided a breakdown voltage between the two conductive regions.

12. The device of claim 1 wherein the array is configured in a regular pattern.

13. The device of claim 1 wherein the array is configured in an irregular pattern.

14. The device of claim 1 wherein one or more of the conductive regions comprises a regular shape and one or more of the conductive regions comprises an irregular shape.

15. The device of claim 1 wherein the voltage discharge region comprises an overlying dielectric layer and the plurality of conductive regions are formed overlying the dielectric layer.

16. The device of claim 1 wherein the plurality of conductive regions are provided by a micromachining process.

17. The device of claim 1 wherein the first direction and the second direction are parallel to the semiconductor substrate.

18. The device of claim 1 wherein the first direction and the second direction are normal to the semiconductor substrate.

* * * * *